United States Patent [19]
Merchant et al.

[11] Patent Number: 6,153,452
[45] Date of Patent: Nov. 28, 2000

[54] METHOD OF MANUFACTURING SEMICONDUCTOR DEVICES HAVING IMPROVED POLYCIDE INTEGRITY THROUGH INTRODUCTION OF A SILICON LAYER WITHIN THE POLYCIDE STRUCTURE

[75] Inventors: Sailesh M. Merchant, Orlando, Fla.; Arun K. Nanda, Austin, Tex.; Pradip K. Roy; Hem M. Vaidya, both of Orlando, Fla.

[73] Assignee: Lucent Technologies Inc., Murray Hill, N.J.

[21] Appl. No.: 08/782,010

[22] Filed: Jan. 7, 1997

[51] Int. Cl.⁷ .................................................. H01L 21/8238
[52] U.S. Cl. ........................ 438/199; 438/592; 204/192.17
[58] Field of Search ..................... 438/658, 656, 438/592, 683, 638, 649, 199, 652, 655, 657; 204/192.15, 192.17, 192.23

[56] References Cited

U.S. PATENT DOCUMENTS

| | | | |
|---|---|---|---|
| 4,443,914 | 4/1984 | Hwang et al. | 29/571 |
| 5,387,535 | 2/1995 | Wilmsmeyer | 437/50 |
| 5,407,839 | 4/1995 | Maruo | 438/29 |
| 5,441,914 | 8/1995 | Taft et al. | 438/592 |
| 5,525,543 | 6/1996 | Chen | 438/190 |
| 5,558,910 | 9/1996 | Telford et al. | 427/255 |
| 5,589,417 | 12/1996 | Jeng | 438/643 |
| 5,725,739 | 3/1998 | Hu | 204/192.3 |
| 5,770,494 | 6/1998 | Yamamoto et al. | 430/232 |
| 5,804,499 | 9/1998 | Dehm et al. | 438/592 |
| 5,851,922 | 12/1998 | Bevk et al. | 438/655 |
| 5,861,233 | 1/1999 | Sekine et al. | 430/296 |
| 5,877,063 | 3/1999 | Gilchrist | 438/398 |

*Primary Examiner*—Olik Chaudhuri
*Assistant Examiner*—Kurt Eaton

[57] ABSTRACT

Methods of manufacturing a semiconductor device. One method includes the steps of: (1) providing a substrate over which is to be deposited a metal silicide layer having a stoichiometric ratio within a desired range, (2) providing a target composed of a metal silicide, the target subject to degradation by reason of use, (3) sputtering atoms from the target to form the metal silicide layer over the substrate, the stoichiometric ratio subject to being without the desired range by reason of the degradation of the target and (4) depositing a predetermined amount of silicon on the metal silicide layer to return the stoichiometric ratio to within the desired range, a useful life of the target thereby increased.

20 Claims, 1 Drawing Sheet

METHOD OF MANUFACTURING SEMICONDUCTOR DEVICES HAVING IMPROVED POLYCIDE INTEGRITY THROUGH INTRODUCTION OF A SILICON LAYER WITHIN THE POLYCIDE STRUCTURE

TECHNICAL FIELD OF THE INVENTION

The present invention is directed, in general, to semiconductor fabrication and, more specifically, to a method of manufacturing semiconductor devices containing a polycide layer wherein an integrity of the polycide layer is improved by introducing a sacrificial silicon layer within the polycide structure.

BACKGROUND OF THE INVENTION

Doped polycrystalline silicon ("poly-Si") is most commonly used as a gate electrode in metal oxide semiconductor ("MOS")-based circuits. Due to the ever shrinking size of electrical components in general, MOS devices have also become smaller, and as their size has decreased, the resistivity of the poly-Si, unfortunately, has also increased, which, in turn, has affected the device RC-delay ("RC"). This is disadvantageous to the device because RC delays caused by high sheet resistance between 20–100 ohms/square of poly-Si runners, limit the performance of the integrated circuits with $n^+$ doped poly-Si, and their performance also deteriorates as the length of these runners increases.

To overcome the problems associated with this increased resistance, a polycide stack ("poly-Si/silicide") is extensively used. Typically, the poly-Si is clad with a low-resistivity silicide such that the sheet resistance of the polycide is between 5–10 ohms/sq from 20–100 ohms/sq without the silicide. The ratio of silicon to metal (Si/M) of the silicide is important to maintain in the range of about 2:1 to about 2.8:1 because if the Si/M ratio falls below this level, the polycide becomes metal rich, which affects the resistivity within the poly-Si gate in an undesirable manner.

Physical vapor deposition ("PVD") is typically used to deposit this silicide layer because the PVD technique produces a smoother, amorphous-type barrier, as compared to the chemical vapor deposition ("CVD") films, which are rougher and crystalline or nano-crystalline. Typically, silicon sputters differentially from the metal in PVD targets, and so, to compensate for the correct film stoichiometry, the target material and the film generally contains excess Si. Moreover, a silicide target shows a drop in silicon to metal (Si/M) ratio as a function of its useful life. Films deposited from a continually eroding target will show a progressive decrease in the Si/M ratio. When the film composition drops below the required 2:1 ratio, the target is discarded, often with significant material wasted, thereby, adding to increase cost per device per wafer.

Therefore, what is needed in the art is a method that provides an in-situ intermediate layer of PVD amorphous silicon when the useful life of the target, as determined by the Si/M ratio, falls below a predetermined level, to thereby prolong the useful life of the target and decrease the overall cost of the semiconductor device.

SUMMARY OF THE INVENTION

To address the above-discussed deficiencies of the prior art, the present invention provides methods of manufacturing a semiconductor device. One method includes the steps of: (1) providing a substrate over which is to be deposited a metal silicide layer having a stoichiometric ratio within a desired range, (2) providing a target composed of a metal silicide, the target subject to degradation by reason of use, (3) sputtering atoms from the target to form the metal silicide layer over the substrate, the stoichiometric ratio subject to being without the desired range by reason of the degradation of the target and (4) depositing a predetermined amount of silicon on the metal silicide layer to return the stoichiometric ratio to within the desired range, a useful life of the target thereby increased.

The present invention therefore introduces the broad concept of augmenting a metal silicide layer with silicon when the target employed to form the metal silicide layer has degraded to without the desired stoichiometric range. The target therefore remains useful for sputtering even when degraded. Thus, the useful life of the target, which as set forth above is quite expensive, is dramatically increased.

In one embodiment of the present invention, the step of providing the substrate comprises the step of providing a silicon substrate. The substrate can alternatively be gallium arsenide or any other conventional or later-discovered substrate suitable for providing a foundation for a solid state device.

In one embodiment of the present invention, the step of providing the target comprises the step of providing a target composed of a metal silicide selected from the group consisting of: (1) tungsten silicide, (2) titanium silicide, (3) tantalum silicide, (4) cobalt silicide and (5) molybdenum silicide. Those skilled in the art are familiar with other metals that may be advantageous, depending upon the application. In an embodiment to be illustrated and described, the metal is tungsten.

In one embodiment of the present invention, the desired range is from 2.0:1 to 2.8:1 silicon atoms to metal atoms. Preferably, the desired range is from 2.2:1 to 2.5:1 silicon atoms to metal atoms. More preferably, however, the desired range is from 2.3:1 to 2.8:1 in the target and 2.2:1 to 2.5:1 in the film. Of course, the desired range may be otherwise and still remain within the broad scope of the present invention.

In one embodiment of the present invention, the semiconductor device is a CMOS device. The device may be other than a CMOS device, however.

In one embodiment of the present invention, the method further comprises the step of doping the substrate to form source and drain regions therein. Those skilled in the art are familiar with how doped regions are formed in semiconductor substrates. The present invention is adapted to function in an otherwise conventional semiconductor device.

In one embodiment of the present invention, the method further comprises the step of forming a polysilicon layer over the substrate prior to the step of sputtering, the metal silicide layer thereby formed on the polysilicon layer. The polysilicon layer is part of a gate of the semiconductor device. Of course, other applications may call for the metal silicide layer to be deposited directly on the substrate, or for other types of layers to be interposed between the metal silicide layer and the substrate.

In one embodiment of the present invention, the method further comprises the step of determining the stoichiometric ratio by a process selected from the group consisting of: (1) Rutherford backscattering spectroscopy and (2) X-ray fluorescence. Those skilled in the art are familiar with such techniques. The present invention is not limited by the particular technique or process employed to determine the stoichiometric ratio.

In one embodiment of the present invention, the step of depositing the silicide is performed with a PVD process. Alternatively, the step of depositing may be performed with a CVD process. The present invention does not rely on a particular method of depositing the silicon layer.

In one embodiment of the present invention, the method further comprises the step of forming a remainder of the semiconductor device using 0.5, 0.35 or 0.25 micron processes. These and other emerging technologies particularly benefit from the tightly-controlled metal silicide layer produced by virtue of the present invention. Those skilled in the art, however, will perceive other applications for the methods of the present invention apart from such processes.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
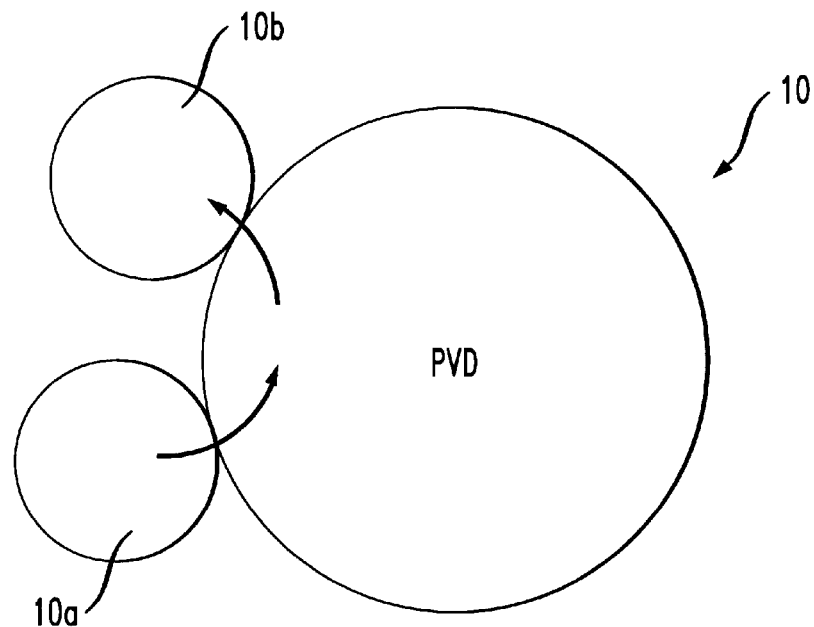
FIG. 1 illustrates a schematic diagram of a conventional PVD tool, including an additional silicon deposition chamber.

Turning initially to FIG. 1, there is illustrated a PVD tool 10 having a metal silicide deposition chamber 10a and a silicon deposition chamber 10b. Chamber 10a contains the silicide target in which the silicide is deposited on top of polycrystalline silicon that forms part of a conventional gate structure on the semiconductor device. The PVD tool is conventional in every aspect with the important exception that it includes the additional in-situ silicon chamber 10b for depositing additional silicon on the metal silicide layer, once sputtering is complete within the metal silicide deposition chamber 10a.

Figure 2:
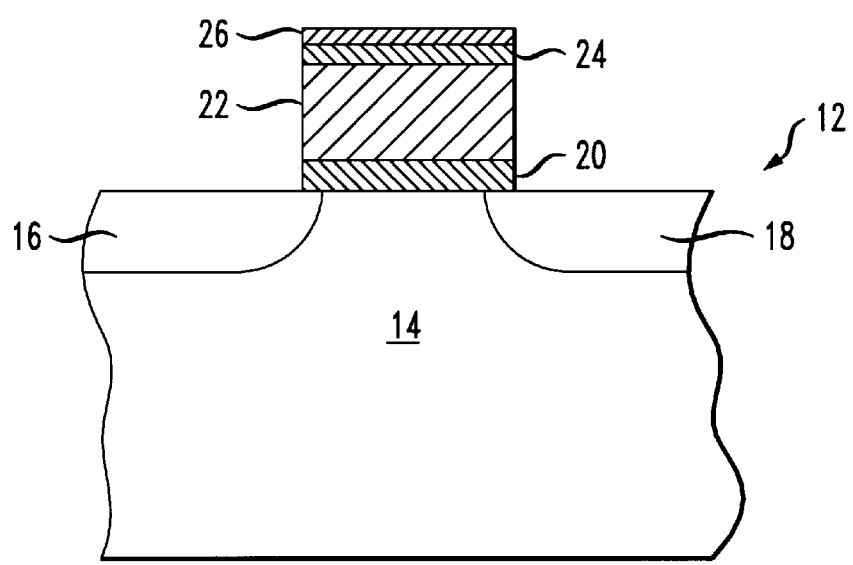
FIG. 2 illustrates a cross-sectional view of a semiconductor device with the sacrificial layer deposited on the poly-Si/silicide gate structure.

Turning now to FIG. 2, a cross-sectional view of a semiconductor 12 manufactured in accordance with the present invention is shown. The semiconductor 12 includes a substrate 14, which is typically comprised of silicon or another semiconductor material known to those skilled in the art. The substrate 14 is doped in accordance with standard practices and includes a source region 16 and a drain region 18. A gate oxide layer 20 formed in accordance with conventional techniques. The layer 22 is preferably a doped polycrystalline silicon material having the desired level of resistivity. Overlaying the gate poly-Si layer 22 is a metal silicide layer 24. The metal silicide layer 24 is deposited preferably using conventional PVD techniques and is preferably comprised of tungsten silicide, although other types of suicides such as titanium silicide, tantalum silicide, cobalt silicide or molybdenum silicide may also be used.

The metal silicide layer 24 has a predetermined stoichiometric ratio of silicon to metal that preferably ranges from about 2.0:1 to about 2.8:1, and more preferably ranges from about 2.2:1 to about 2.5:1. The metal silicide layer 24 is formed by sputtering atoms from a conventional metal silicide target, preferably tungsten silicide. The metal silicide target is subject to degradation; that is, since more silicon is removed than metal during the deposition process, the silicon on the target reaches a point where there is not a sufficient amount of silicon to maintain the required ratio of excess silicon to metal. Under normal conditions, the metal silicide layer 24 is deposited to a thickness of about 50–100 nm under a pressure to 2–7 milli-torr and a temperature of about 300–400° C. The ratio of silicon to metal can be monitored and determined, for example on control wafers by such known methods as Rutherford back scattering spectroscopy, x-ray fluorescence or mass balance calculations. When the measured ratio of silicon to metal falls below the predetermined level, the substrate/wafer is moved to the silicon deposition chamber 10b, which is adjacent chamber 10a in which the metal silicide layer 24 is deposited. For example, if the ratio of silicon to metal is 1.8:1, then the semiconductor is moved to chamber 10b to receive an amount of silicon to bring the ratio to the predetermined level. On the other hand, if the ratio is at the predetermined level, then any other conventional steps that are necessary to complete the production of the semiconductor are taken.

Upon transfer of the semiconductor device into chamber 10b, a silicon layer 26, in preferred embodiments, is sputtered over the metal silicide layer 24. The thickness or amount of the silicon layer 26 depends on the amount of silicon that needs to be added to the metal silicide layer 24 to bring the metal silicide layer 24 to the predetermined silicon to metal ratio. Again, the amount of silicon that needs to be deposited can be determined by the methods previously mentioned, which are well known in the art.

In a preferred embodiment, deposition of the silicon may be conducted at a pressure of 2–10 millitorr and at a temperature that ranges from about 25° C. to about 200° C. During its deposition, or during subsequent processing, the silicon migrates into the deficient metal silicide layer 24 to achieve the proper silicon to metal ratio. Thus, the present invention provides a semiconductor device that has the desired metal silicide ratio even though the metal silicide target is not capable of achieving the proper metal to silicon ratio.

From the foregoing it is seen that the present invention provides methods of manufacturing a semiconductor device. One method includes the steps of: (1) providing a substrate over which is to be deposited a metal silicide layer having a stoichiometric ratio within a desired range, (2) providing a target composed of a metal silicide, the target subject to degradation by reason of use, (3) sputtering atoms from the target to form the metal silicide layer over the substrate, the stoichiometric ratio subject to being without the desired range by reason of the degradation of the target and (4) depositing a predetermined amount of silicon on the metal silicide layer to return the stoichiometric ratio to within the desired range, a useful life of the target thereby increased.

The present invention therefore introduces the broad concept of augmenting a metal silicide layer with silicon when the target employed to form the metal silicide layer has degraded to without the desired stoichiometric range. The target therefore remains useful for sputtering even when degraded. Thus, the useful life of the target, which as set forth above is quite expensive, is dramatically increased.

Although the present invention and its advantages have been described in detail, those skilled in the art should understand that they can make various changes, substitutions and alterations herein without departing from the spirit and scope of the invention in its broadest form.

What is claimed is:

1. A method of manufacturing a semiconductor device, comprising:

providing a substrate over which is to be deposited a metal silicide layer having a stoichiometric ratio within a desired range;

providing a target composed of a metal silicide, said target subject to degradation by reason of use;

sputtering atoms from said target to form said metal silicide layer over said substrate, said stoichiometric ratio of said metal silicide layer subject to being without said desired range by reason of said degradation of said target; and depositing a predetermined amount of silicon on said metal silicide layer to return said stoichiometric ratio of said metal silicide layer to within said desired range.

2. The method as recited in claim 1 wherein providing said substrate comprises providing a silicon substrate.

3. The method as recited in claim 1 wherein providing said target comprises providing a target composed of a metal silicide selected from the group consisting of:

titanium silicide, tungsten silicide, tantalum silicide, cobalt silicide, and molybdenum silicide.

4. The method as recited in claim 1 wherein said desired range is from 2.0:1 to 2.8:1 silicon to metal atoms.

5. The method as recited in claim 1 wherein said desired range of the silicide film is from 2.2:1 to 2.5:1 silicon atoms to metal atoms; and a ratio of silicon atoms to metal atoms of said target material is from about 2.3:1 to 2.8:1.

6. The method as recited in claim 1 wherein said semiconductor device is a complementary metal oxide semiconductor (CMOS) device.

7. The method as recited in claim 1 further comprising doping said substrate to form source and drain regions therein.

8. The method as recited in claim 1 further comprising forming a polysilicon layer over said substrate prior to sputtering, said metal silicide layer thereby formed on said polysilicon layer.

9. The method as recited in claim 1 further comprising determining said stoichiometric ratio by a process selected from the group consisting of:

Rutherford backscattering spectroscopy, and

X-ray fluorescence.

10. The method as recited in claim 1 wherein depositing is performed with a physical vapor deposition (PVD) process.

11. A method of manufacturing a semiconductor device, comprising:

providing a substrate over which is to be deposited a metal silicide layer having a stoichiometric ratio within a desired range of 2.0:1 to 2.8:1;

providing a target composed of a metal silicide, said target subject to degradation by reason of use;

sputtering atoms from said target to form said metal silicide layer over said substrate, said stoichiometric ratio of said metal silicide layer subject to falling below 2.0:1 by reason of said degradation of said target; and depositing a predetermined amount of silicon on said metal silicide layer to return said stoichiometric ratio of said metal silicide layer to at least 2.0:1.

12. The method as recited in claim 11 wherein providing said substrate comprises providing a silicon substrate.

13. The method as recited in claim 11 wherein providing said target comprises providing a target composed of a metal silicide selected from the group consisting of:

titanium silicide, tungsten silicide, tantalum silicide, cobalt silicide, and molybdenum silicide.

14. The method as recited in claim 11 further comprising forming a remainder of said semiconductor device using 0.5, 0.35, or 0.25 micron processes.

15. The method as recited in claim 11 wherein said desired range of the silicide film is from 2.2:1 to 2.5:1 silicon atoms to metal atoms; and a ratio of silicon atoms to metal in said target material is from about 2.3:1 to about 2.8:1.

16. The method as recited in claim 11 wherein said semiconductor device is a complementary metal oxide semiconductor (CMOS) device.

17. The method as recited in claim 11 further comprising doping said substrate to form source and drain regions therein.

18. The method as recited in claim 11 further comprising forming a polysilicon layer over said substrate prior to sputtering, said metal silicide layer thereby formed on said polysilicon layer.

19. The method as recited in claim 11 further comprising determining said stoichiometric ratio by a process selected from the group consisting of:

Rutherford backscattering spectroscopy, and

X-ray fluorescence.

20. The method as recited in claim 11 wherein depositing is performed with a physical vapor deposition (PVD) process.

* * * * *